(12) United States Patent
Maglione et al.

(10) Patent No.: US 10,060,453 B2
(45) Date of Patent: Aug. 28, 2018

(54) CYLINDER-PISTON UNIT AND METHOD OF DETECTING CONTINUOUSLY THE RECIPROCAL POSITION BETWEEN CYLINDER AND PISTON OF SUCH UNIT

(71) Applicants: OPTOELETTRONICA ITALIA SRL, Gardolo (TN) (IT); GIULIANI SRL, Suzzara (MN) (IT)

(72) Inventors: Alfredo Maglione, Povo (IT); Nicola Battisti, Trento (IT)

(73) Assignees: OPTOELETTRONICA ITALIA SRL (IT); GIULIANI SRL (IT)

( * ) Notice: Subject to any disclaimer, the term of this patent is extended or adjusted under 35 U.S.C. 154(b) by 309 days.

(21) Appl. No.: 14/910,613

(22) PCT Filed: Jul. 24, 2014

(86) PCT No.: PCT/IB2014/063365
§ 371 (c)(1),
(2) Date: Feb. 5, 2016

(87) PCT Pub. No.: WO2015/019231
PCT Pub. Date: Feb. 12, 2015

(65) Prior Publication Data
US 2016/0177981 A1    Jun. 23, 2016

(30) Foreign Application Priority Data
Aug. 7, 2013   (IT) .............................. VR2013A0191

(51) Int. Cl.
| | |
|---|---|
| G01D 5/34 | (2006.01) |
| F15B 15/28 | (2006.01) |
| G01D 5/347 | (2006.01) |
| H03M 1/28 | (2006.01) |
| G01D 5/246 | (2006.01) |
| H03M 1/20 | (2006.01) |

(52) U.S. Cl.
CPC ...... *F15B 15/2846* (2013.01); *F15B 15/2876* (2013.01); *G01D 5/34746* (2013.01);
(Continued)

(58) Field of Classification Search
CPC ............ G01D 5/34746; G01D 5/34792; F15B 15/2846; F15B 15/2876; H03M 1/287
See application file for complete search history.

(56) References Cited

U.S. PATENT DOCUMENTS 6,327,791 B1 * 12/2001 Norcross ............. F15B 15/2846
33/706
6,452,158 B1 * 9/2002 Whatley ............. F15B 15/1457
250/231.13
(Continued)

FOREIGN PATENT DOCUMENTS

| DE | 44 36 784 A1 | 4/1995 |
|---|---|---|
| GB | 2 080 646 | 2/1982 |
| WO | WO 2006/048345 A1 | 5/2006 |

OTHER PUBLICATIONS

International Search Report dated Nov. 24, 2014 issued in corresponding International patent application No. PCT/IB2014/063365.

*Primary Examiner* — F. Daniel Lopez
*Assistant Examiner* — Abiy Teka
(74) *Attorney, Agent, or Firm* — Ostrolenik Faber LLP

(57) ABSTRACT

A cylinder-piston unit including: at least one cylinder including a tubular body (2); at least one piston (5) liable with a respective rod (5a), said piston (5) and said rod (5a) being translatable longitudinally in said tubular body (2) of said cylinder, at least one reference codification (C) extending for at least a section (dC) on the surface of said rod (5a), along the longitudinal axis of the same; at least detecting means (7), movable anchorable to said tubular body (2), faced, in use, towards said rod (5a) and suitable to detect said at least one reference codification (C) and to emit at the output at least a corresponding output electrical signal (s7), at least a reference zone (7c) of amplitude (d7c) delimited from said detecting means (7), said at least one reference (Continued)

codification (C) being detectable in correspondence to said at least one detection zone (7c); said at least one reference codification (C) including at least one plurality of adjacent sectors ( . . . , Si−1, Si, Si+1, . . . ) extending along said longitudinal axis of said rod (5a), each of them for a section (dSi) of equal length; each sector (Si) includes a plurality of optical contrast zones (si1, si2, si3), each of them extending along said longitudinal axis of said rod (5a) for a respective section of extension (dsi1, dsi2, dsi3) such as the sum of the extensions of said sections of extensions (dsi1+dsi2 . . . ), in each sector (Si) is lower or equal to said amplitude (d7c) of said detecting zone (7c); said optical contrast zones (si1, si2, si3) being arranged in each sector (Si) according to the same sequence; and wherein in each sector (Si) at least one optical contrast zone (si1, si2, si3) shows said at least one respective section of extension (ds1, ds2, ds3) of different length compared to the length of the same section of extension in the other sectors (Si−2, Si−1, Si+1, Si+2, . . . ), therefore each sector (Si) remains univocally definable from the length of said at least one section of extension (dsi1, dsi2, dsi3) of said optical contrast zones (si1, si2, si3) in it included.

12 Claims, 7 Drawing Sheets

(52) U.S. Cl.
CPC ........ *G01D 5/34792* (2013.01); *H03M 1/287* (2013.01); *G01D 5/246* (2013.01); *H03M 1/202* (2013.01)

(56) References Cited

U.S. PATENT DOCUMENTS

| | | | |
|---|---|---|---|
| 7,175,446 B2* | 2/2007 | Bright | H01R 23/688 439/79 |
| 7,552,671 B2* | 6/2009 | Neumann | G01D 5/34761 91/1 |

* cited by examiner

CYLINDER-PISTON UNIT AND METHOD OF DETECTING CONTINUOUSLY THE RECIPROCAL POSITION BETWEEN CYLINDER AND PISTON OF SUCH UNIT

CROSS REFERENCE TO RELATED APPLICATIONS

The present application is a 35 U.S.C. § 371 National Phase conversion of PCT/IB2014/063365, filed Jul. 24, 2014, which claims benefit of Italian Application No. VR2013A000191, filed Aug. 7, 2013, the disclosure of which is incorporated herein by reference. The PCT International Application was published in the English language.

TECHNICAL FIELD OF THE INVENTION

The present invention concerns a hydraulic or pneumatic cylinder-piston unit, as well as a method of continuous detecting of the reciprocal position between the cylinder and the piston of such unit.

BACKGROUND OF THE INVENTION

With the term "reciprocal position between the cylinder and piston" in the current description and in the following claims it means the distance traveled by a piston, during its motion in the respective cylinder, respect to an own stand-off position. For example, in case of a cylinder-piston unit having double effect, the stand-off position of a piston coincide to the position in which it stands at the same distance respect to both the head's extremities of the respective cylinder.

In the state of the art in order to know continuously the reciprocal position between a cylinder and its respective piston in it translatable, it expects to obtain a reference codification, located on the rod of the piston, for example manufactured with stainless steel. Such reference codification is obtained for example with laser marking technology, in a predefined length' section of the piston's rod and it usually shows both marked zones and unmarked zones. Such sections of the reference codification, marked or unmarked, reflect in different way the light radiations on them incident.

A portion of reference codification is detectable continuously, during the piston's motion in the cylinder, through suitable detecting means which are usually arranged in the cylinder of the cylinder-piston unit. The portion of reference codification detectable continuously from the detecting means is correlatable to the reciprocal position between cylinder and piston.

The traditional detecting means include an emitter means of light radiations, destined to hit, in use, a section of the piston's rod surface and a respective sensor's means, in charge to detect such light radiations reflected from the rod's surface and to emit, in output, an suitable output signal.

As disclosed above, the survey of a section of reference codification, on the piston's rod, is based on the reflection's difference of the light radiations, incident on the rod itself. The light radiations produced from the emitter means are, indeed, reflected almost totally from the unmarked surface of the piston's rod, while they are indeed in majority absorbed, when they are incident on a marked surface of the rod. The consequence is that the electrical signal at the output of the sensor's means, typically analogue type, presents, in correspondence to a code' section of processed code (marking), a different amplitude in comparison to the one detectable in correspondence to a section of rod which is not interested to such process.

The output signal of the sensor's means is expect to be later continuously elaborated from a control and elaboration data unit, that, emits at the output an index correlated to the reciprocal position in that moment acquired between cylinder and piston.

A typical example of reference codification achievable on a rod of a piston is taught in U.S. Pat. No. 6,327,791. In such document the reference codification includes a bar code obtained along the rod of the piston for a section of defined length, which bar code represents a binary codification two or more bit long. Progressively the piston travels in the respective cylinder, the detectable codification section, in use, from the detection means, in correspondence to one detection's zone of theirs for this purpose considered, changes, thus originating a binary code from time to time different. Each detectable binary code in correspondence of the detecting zone is correlatable to a specific position between cylinder and piston and therefore, based of the reading of a section of reference codification, it is possible to obtain the reciprocal position in that moment represented/acquired between cylinder and piston.

SUMMARY OF THE INVENTION

Main object of the present invention is that to supply a cylinder-piston unit provided with an alternative reference codification, which allows detecting, continuously, the reciprocal position between cylinder and piston.

Another object of the present invention is that of make available a cylinder-piston unit having an alternative reference codification, which codification be easy to manufacture at competitive costs on the rod of such cylinder-piston unit.

Another object of the present invention is that of providing a method of detecting continuously of the reciprocal position between a cylinder and a piston of a cylinder-piston unit which must be precise, reliable and trustworthy.

Another object of the present invention is that of make available a method of detecting continuously of the reciprocal position between a cylinder and a piston of a cylinder piston unit which be practical to implement.

According to a first aspect of the present invention it provides for a cylinder piston unit including:
 at least one cylinder including a tubular body;
 at least one piston liable to a respective rod, the piston and the rod being translatable longitudinally into the tubular body of the cylinder,
 at least one reference codification extending for at least one section on the rod's surface, along the longitudinal axis thereof;
 at least detecting means movable anchorable to the tubular body, turned, in use, toward the rod and in charge to detect such at least one reference codification and to emit in output at least one correspondent output electrical signal;
 at least one detecting zone with amplitude defined to such detecting means, such at least one reference codification being detectable in correspondence of such at least one detecting zone;
 characterized in that
 such at least one reference codification includes at least one plurality of adjacent sectors extending along the longitudinal axis of the rod, each of them for a section of the same length;

each sector includes a plurality of zones at optical contrast, each of them extending along such longitudinal axis of the rod for a respective section of extension like that the extension's sum of such sections of extensions, in each sector is lower or equal of such amplitude of such reference zone;

the optical contrast zones are arranged, in each sector, according to the same sequence; and in that in each sector at least such one optical contrast zone shows such at least a respective section of extension of different length compared to the length of the same section of extension in the other sectors, therefore each sector remains univocally definable from the length of such at least a section of extension of such optical contrast zones in it included.

According to an additional aspect of the present invention it provides for a method of detecting continuously of the reciprocal position between a cylinder and a piston of a cylinder-piston unit, the method including the phases of:

arrangement of a cylinder-piston unit according to the first aspect of the present invention;

activation of such at least detecting means;

elaboration of such at least one electrical signal in output to such detecting means;

emission, on the base of such elaboration, of an index correlated to the reciprocal position in that moment represented between such cylinder and such piston;

characterized in that the elaboration phase of such at least one signal includes the measurement, on such at least one signal, of the length of such at least one section of extension of such optical contrast zone or zones, that becomes or become completely represented in such signal.

BRIEF DESCRIPTION OF THE DRAWINGS

Further aspects and advantages of the present invention will appear better from the following detailed description of an example of it of manufacture, currently preferred, illustrated only as example and not limited in the unite drawings, in which:

the FIG. 1a illustrates a lateral view in longitudinal section, of the cylinder-piston unit according to the present invention in which the piston is in a stand-off position;

Figure 1A:
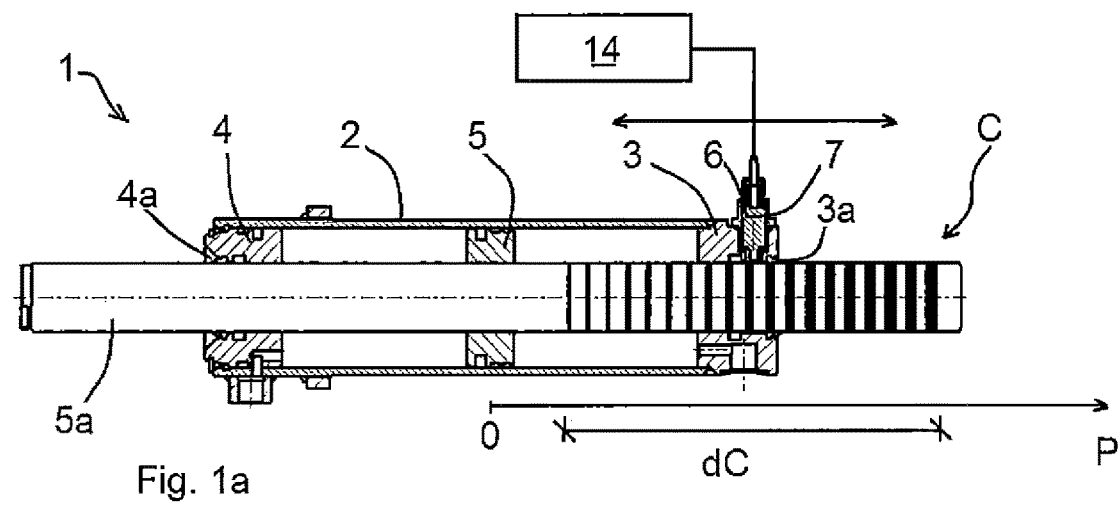
Figure 1B:
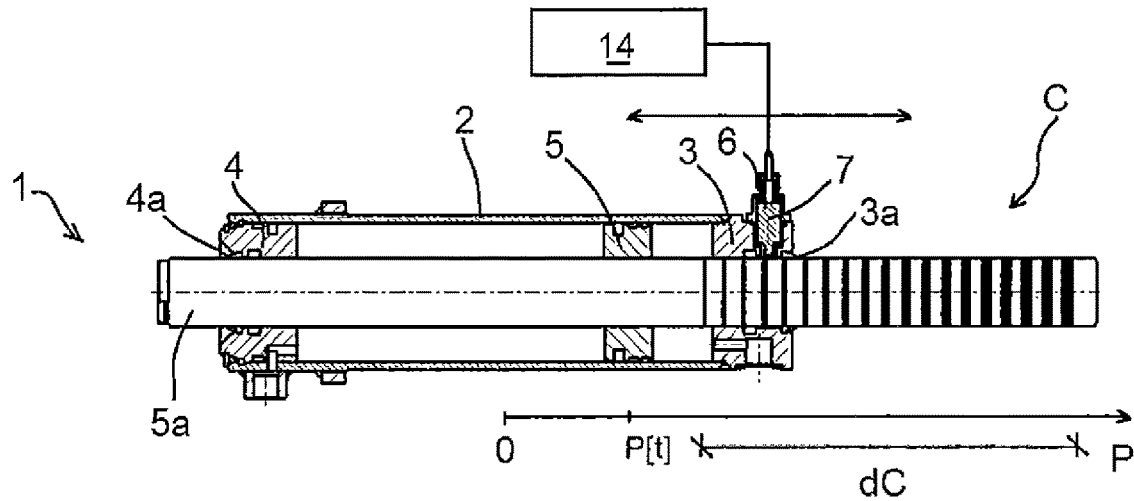
Figure 1C:
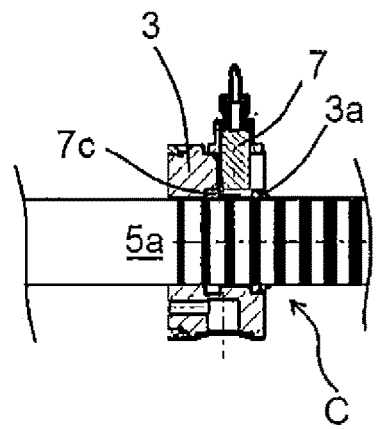
Figure 1D:
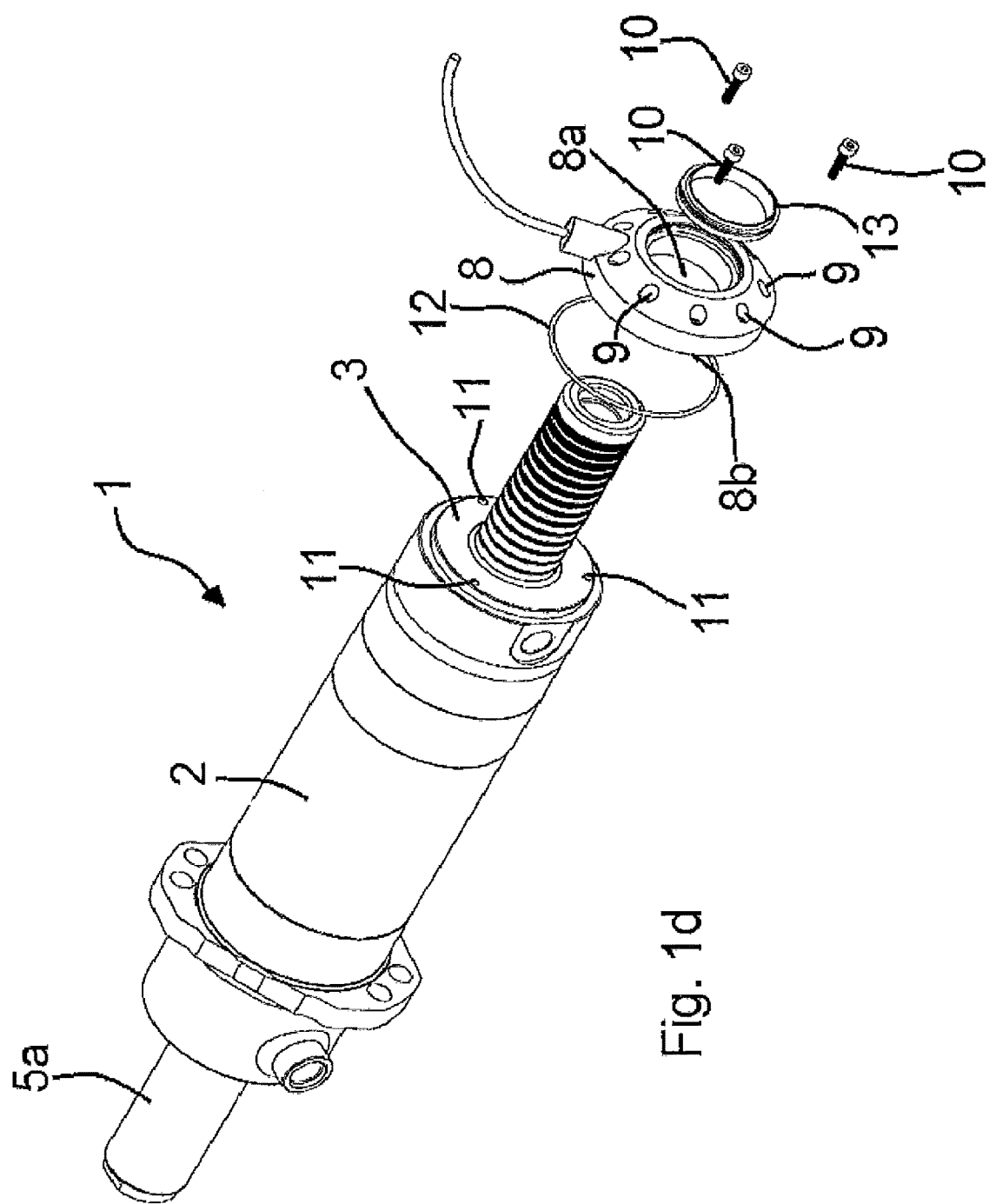
Figure 2A:
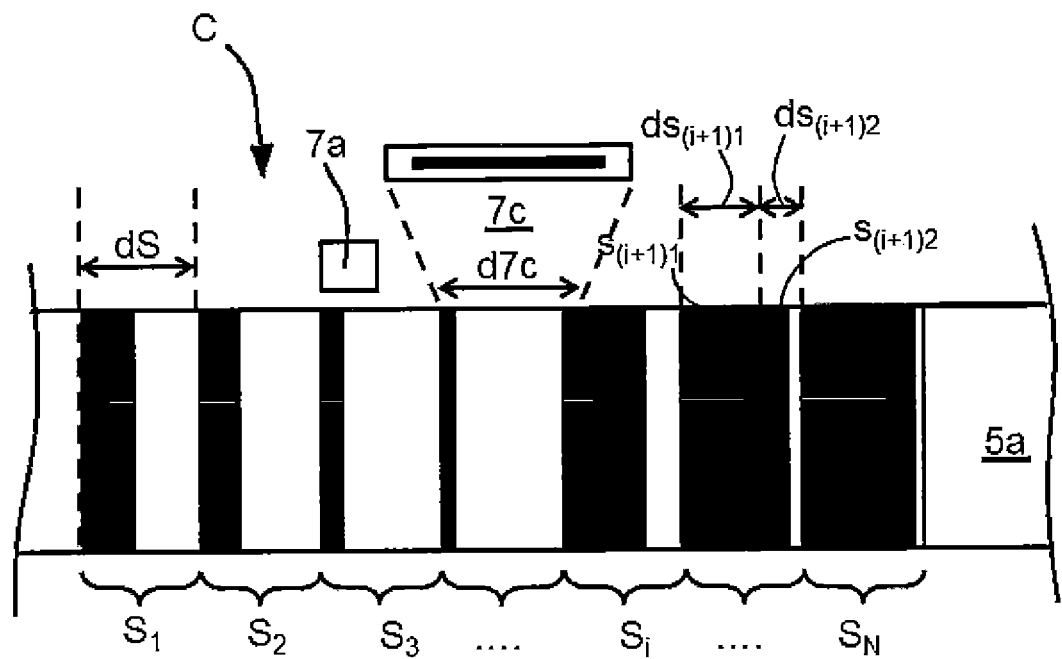
Figure 2B:
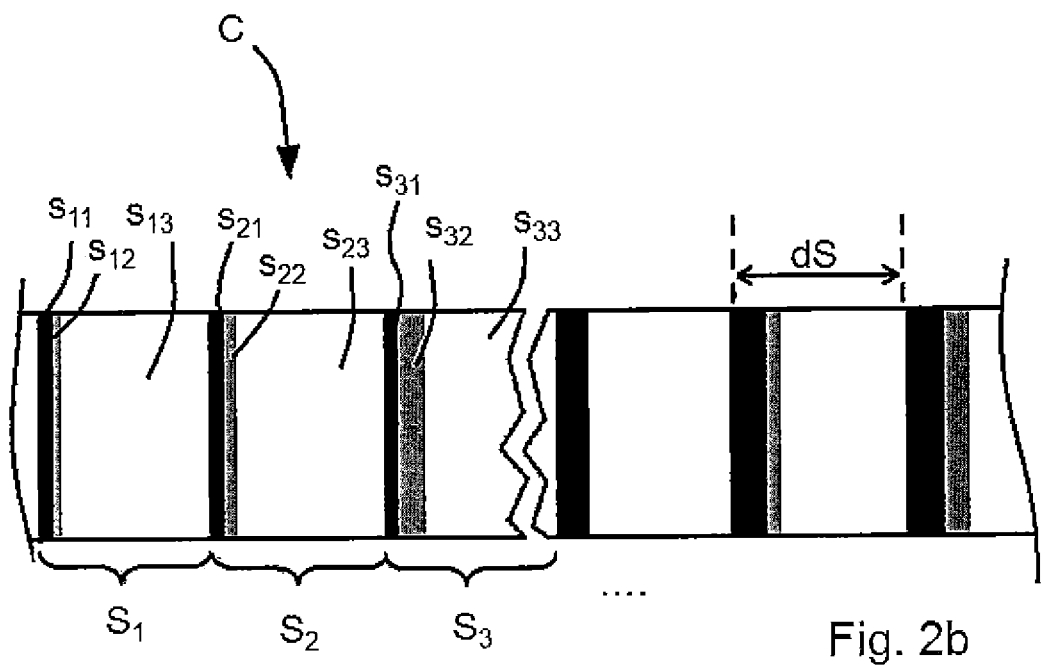

the FIG. 1b illustrates a lateral view in longitudinal section, of the cylinder-piston unit according to the present invention, in which the piston is in the position P[t] respect to the stand-off position;

the FIG. 1c, shows a particular, in zoomed scale, of the cylinder-piston unit's detecting means of the of FIG. 1;

The FIG. 1d is a prospect view, in exploded drawing, of a cylinder-piston unit's variant according to the present invention;

The FIG. 2a illustrates a schematic view, slightly zoomed, of a first example of manufacturing of a reference codification for a cylinder-piston unit according to the present invention;

The FIG. 2b, shows a schematic view, in zoomed scale of a second example of manufacturing of a reference codification for a cylinder-piston unit according to the present invention.

Figure 3:
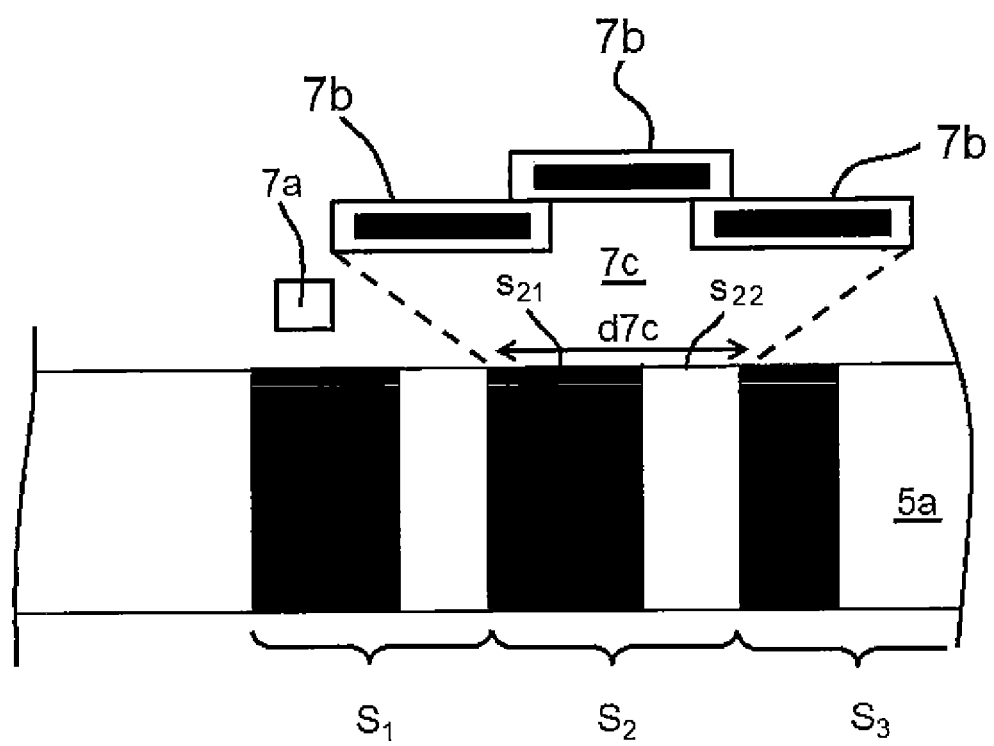
Figure 4:
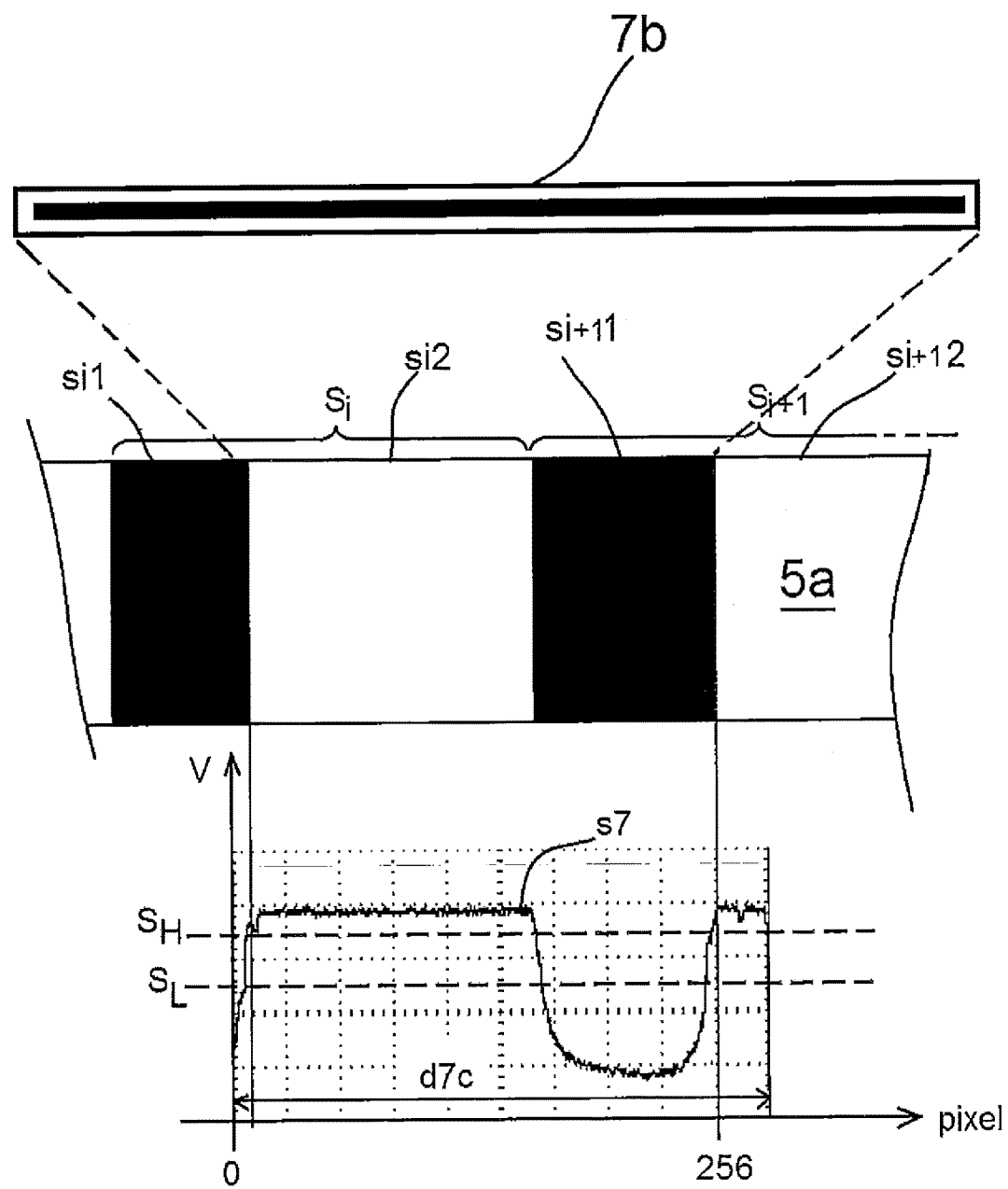
Figure 5A:
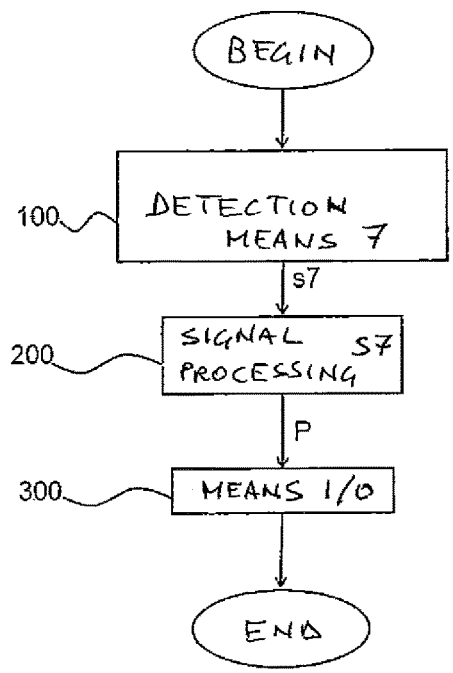
Figure 5B:
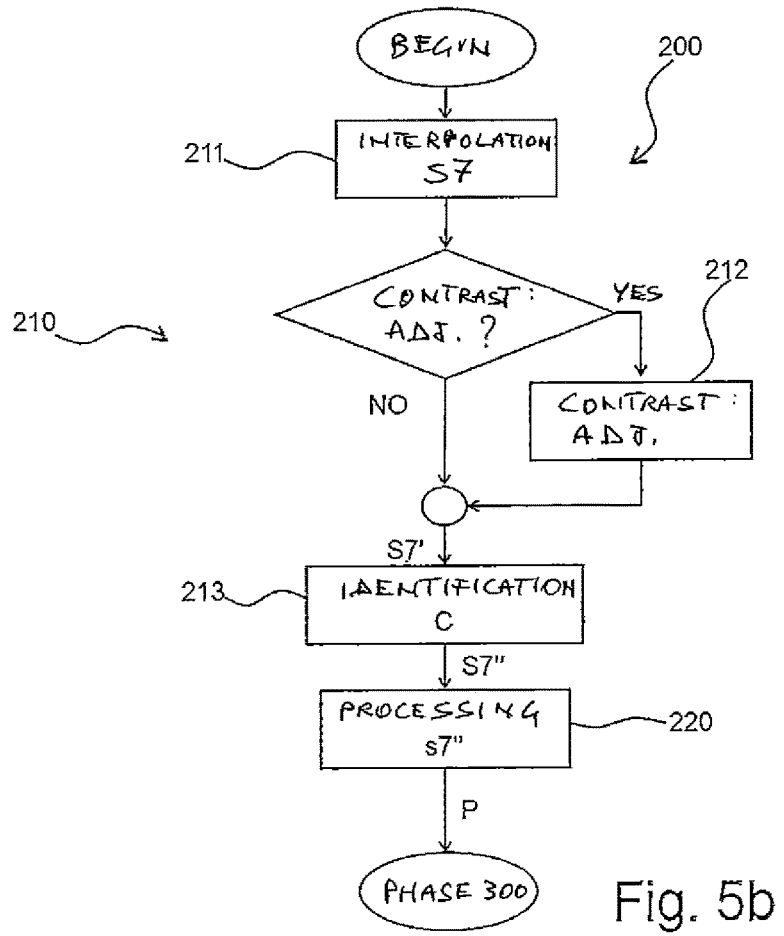
Figure 5C:
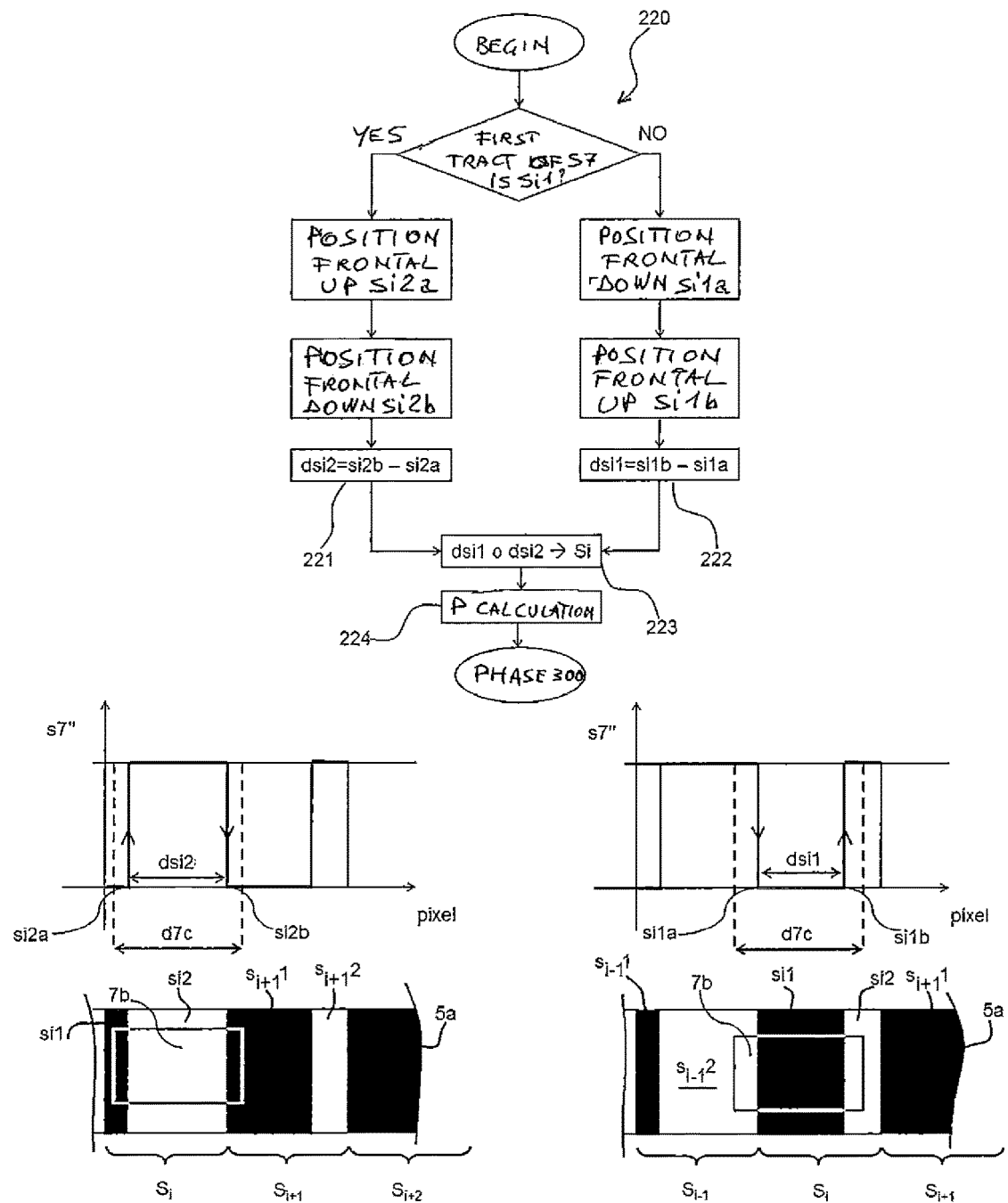

The FIG. 3, shows a schematic view and slightly zoomed of a variant of the detecting means 7 of the cylinder-piston unit according to the present invention;

The FIG. 4, illustrates the typical trend of an electrical signal in output from the detecting means of the cylinder-piston unit according to the present invention, in which the rod of the piston shows the reference codification of FIG. 2a;

The FIG. 5a illustrates the flow diagram of the detecting method in continuous of the reciprocal position between a cylinder and a piston according to the present invention;

The FIG. 5b is a detailed flow diagram of one of the phases of the method of FIG. 5a; and The FIG. 5c shows a detailed flow diagram of another one of the phases of the method of FIG. 5a.

DESCRIPTION OF PREFERRED EMBODIMENTS

In the united drawings, equal parts or components or similar have been identified with the same reference numbers.

With reference now to the Figures from 1a to 1d, it will be noted as a cylinder-piston unit according to the present invention be generally indicated with the reference number 1 and it include a cylinder, typically composed to a tubular body 2, of section preferably circular, closed in correspondence of its extremities from respective head walls 3 and 4. In the tubular body 2 a piston 5 is mounted translatable along its longitudinal axis, connected to a respective rod 5a. The rod 5a exits from the cylinder, in case of a single effect piston (not illustrated in the drawings), trough a respective passing aperture, obtained, in one of the head walls 3 or 4 and, in case of a cylinder-piston double effect unit, through passing apertures 3a and 4a provided, respectively, in the head walls 3 and 4.

On the rod 5a, a reference codification C is obtained, which is achieved, for example, through laser marking of the rod's surface and which extends all around the rod itself and in the longitudinal direction for a predefined section dC, for example equal to 24 cm.

More specific, with reference to FIGS. 2a and 2b and 3, such reference codification C includes one plurality of adjacent sectors S, each of them is indicated in such figures with the reference Si (where i=1, 2, 3, . . . N). The sectors Si of the reference codification C extends along the longitudinal axis of the rod 5a, all of them for a section of equal length dS, for example equal to 7.5 mm.

Each sector Si includes, in turn, two ore more different optical contrast's zones (si1, si2, si3, . . . with i=1, . . . N), each of them is embellished (marked) or not such as, in use, it is reflecting possible light radiations on it incident in different way respect to the other optical contrast zones included into the same sector Si.

Each sector Si can be then interested to high, medium, low contrast zones or to reflective zones (see in particular the FIG. 2b), which follows one another, into each sector, according to the same sequence. Then for example, in the case illustrated in the FIGS. 2a and 3, currently preferred, there are considered in each sector Si of the code C two optical contrast zones and, more specific, one first optical contrast zone si1 which is embellished, for example with laser ablation (represented in the above mentioned Figures with the black colour), and a second optical contrast zone si2, which is not embellished (represented with the white colour).

With reference instead to the FIG. 2b, which illustrates a second preferred example of manufacturing of the reference codification C according to the present invention, each sector Si is interested to three optical contrast zones si1 si2 and si3 and, more specific, observing the piston rod represented in Figure from left to right, each sector Si is affected by a first zone si1 (represented in black), to a second reference zone si2 (represented in grey) and to a third zone si3 (represented with the white colour).

The optical contrast zones (si1, si2, si3, . . . ) of the reference codification C according to the present invention extends, inside a respective sector Si, for a respective section of extension (ds1, ds2, ds3, . . . ). As you will observe, at least one of the optical contrast zones (si1, si2 and si3) varies, from a sector to the other, its own extension along the axis of the rod 5a. In the specific case of the FIGS. 2a and 3, both optical contrast zones si1 and si2 show different sections of extension dsi1 and dsi2 in each sector Si. In case of, instead, represented in FIG. 2b, the si1 zone (represented with the black colour) remains of constant extension along the rod 5a for a certain multiple number of sectors, in the specific case three, varying instead, from one sector to the other, the extension of the optical contrast zones si2 and si3. As it will obviously appear for the skilled person, this second example of realization of the reference codification C allows multiplying in convenient way, along the piston's rod 5a, the possible configurations of the sectors Si of the codification C.

The cylinder-piston unit according to the present invention includes detecting means 7 intended to detect the reference codification C during the travel of the piston 5 inside the cylinder 2. Such detecting means are considered, according to a first variant of the present invention, accommodated in a through receiving seat 6 (FIGS. 1a, 1b and 1c), preferably obtained in correspondence to one of the two head walls of the cylinder, in the specific case illustrated in the FIGS. 1a and 1b in the head wall 3. Such through receiving seat 6 is suitable to receive and to maintain in it engaged the above mentioned detecting means 7, which are, in use, in it accommodated addressed towards the rod 5a of the cylinder-piston unit. If desired the receiving seat 6 could be obtained also in the tubular body 2, for example in a central position of it.

According to a second variant of the present invention, with reference to the FIG. 1d, the detecting means 7 are expected anchorable to the cylinder 2 of the cylinder-piston unit and, more specific, they can be accommodate in a disc body 8, provided of a passing through aperture 8a, which give it insertable in one portion of rod 5a of the piston 5 coming out from the cylinder 2. Such disc body 8, shows a side fundamentally flat 8b, intended, in use, to be juxtaposed to the head wall 3 of the cylinder. Into the disc body 8 it is furthermore obtained a plurality of passing through apertures 9, arranged each other with an angular offset around the passing through aperture 8a. Such passing through apertures 9 act as receiving seat for respective movable means of engagement 10 between the disc body 8 and the cylinder 2 of the cylinder-piston unit.

For example, in the illustrated case in FIG. 1d, the movable means of engagement 10 include, a triplet of screws screwable in respective seat of engagement 11 for this scope manufactured into the head wall 3 of the cylinder 2. In the illustrated case, the movable seats of engagement 11 include, a triplet of receiving seats threaded with thread's step corresponding to that of respective screws 10. Similarly to the first variant of the cylinder-piston unit according to the present invention, in the disc body 8 is expected through receiving seat 6 (not illustrated in the drawings), suitable to receive and maintain in it engaged detecting means 7 addressed towards the aperture 8a and, then, towards the rod 5a of the cylinder-piston unit in it insertable. With a such configuration of the disc body 8, anchorable to the cylinder 2, with respective movable engagement means 10 according to a plurality of angular positions, it can be easily understandable that the detecting means 7 into the disc body 8, result advantageously adjustable around the rod 5a of the cylinder-piston unit.

In the cylinder-piston unit according to the second example of realization of the present invention, there are expected also gaskets elements 12 and 13 between, respectively, the head wall 3 of the cylinder 2 and the disc body 8 and between the disc body 8 and the rod 5a of the piston. Such gasket elements 12 and 13 prevent the dirt, in the working zone of the cylinder-piston unit, to penetrate in the disc body 8 and they contribute then to maintain clean the zone of data detection of the detection's means.

The detection's means 7 of the cylinder-piston unit according to the present invention include at least a emitter means 7a of light radiation RL, for example including one or more LED (sketched in the FIGS. 2a and 3), turned toward the rod 5a and designed, in use, to emit light radiations RL against it during the travel of the piston in the cylinder. Advantageously, the detecting means 7 include furthermore at least one sensor means 7b, suitable to detect the light radiations reflected from the rod 5a. The detecting means 7 delimit a zone or region of detecting 7c of amplitude d7c, (do particular reference to the FIG. 3) in correspondence of which the means or the emitters' means 7a and the means or the sensors' means 7b, respectively, emit and detect the light radiations RL towards/from the rod 5a.

The detecting means 7 of the cylinder-piston unit take advantage of, as the sensor's means of the technical note, the difference in the reflection of the light radiations RL that hit the rod 5a in correspondence of the reference codification C. With reference to FIGS. 2a and 3, indeed, when the light radiations hit the rod 5a in correspondence to a first marked zone (si1) of the reference codification C, they are in larger part absorbed, so that only a fraction of them is reflected and it results therefore detectable from the sensor's means or from the sensors' means 7b. In the opposite case in which the light radiations RL hit the rod 5a in correspondence to a second optical contrasted unmarked zone si2 of the reference codification C, they are in larger part reflected and directed towards the sensor's means or sensors' means 7b. The consequence is that the output signal from each sensor's means 7b, usually analogue type, is a "steps signal" s7, for example of the type illustrated in FIG. 4.

Such signal s7 shows a major amplitude (roughly next to the supply voltage Vcc of the detecting means) when, in correspondence of the zone or region of detecting 7c of the detecting means 7, an optical contrast unmarked zone si2 occurs of a section of reference codification C. When, on the other hand, in the detecting region 7c a first marked zone si1 occurs of the reference codification C, the signal s7 shows lower amplitude.

The signal s7 then, see always FIG. 4, is an analogue signal, with steps, which width, in a determined instant t, is essentially proportional to the dimensions d7c of the detecting zone 7c of the detecting means 7 and whose trend reflects the trend of the optical contrast zones si1 and si2 of the reference codification C in that moment detected from the detecting means 7.

Advantageously, in each sector Si of the reference codification C, each optical contrast zone si1, si2, si3, ecc. extends for a respective section of extension dsi1, dsi2, dsi3, ecc. along the rod 5a therefore the sum of such sections of extension is equal to the amplitude dS of each sector and lower or equal to the amplitude d7c of the detecting zone 7c of the detecting means 7. With such configuration, in every moment during the travel of the piston into the cylinder, the detecting means 7 detect, in correspondence of the respective detecting zone 7c, a section of reference codification C in which at least one of the optical contrast zones si1, si2, si3, . . . of a respective sector Si is completely included.

Even more advantageously, at least one of the optical contrast zones si1, si2, si3, ecc. in a respective sector Si shows the respective section of extension dsi1, dsi2, dsi3, ecc. of different length respect to the length of the same section of extension in the other sectors of the codification C, therefore the i-th sector Si of the reference codification C results univocally identifiable from the length of at least a section of extension dsi1, dsi2, dsi3 ecc. of the optical contrast zones si1, si2, si3, ecc. in it included. As it is obvious, having each sector Si constant length dS, the variation of a section of extension dsi1 or dsi2 or dsi3 in the i-th sector, imply the variation of at least another section of extension dsi1 or dsi2 or dsi3 inside the same sector.

According to a first example of manufacturing currently preferred of the cylinder-piston unit according the present invention (refer to the FIGS. 2a and 4), the detecting means include only one sensor's means 7b, for example CCD type with 256 pixels. The amplitude of the detecting zone d7c will correspond in this case at the 256 pixels of the sensor CCD (as indicated in the horizontal axis of the graph in FIG. 4).

According to a variant of the present invention (FIG. 3), the detecting means 7 of the cylinder-piston unit 1 include a plurality of sensor's means 7b considered placed side by side, they too, for example, CCD type with 256 pixels.

As you will note, according to such variant, the amplitude d7c of the detecting zone 7c of the detecting means 7 is proportional to the number of sensor's means 7b provided and therefore greater than the one of the first example of manufacturing. In this case, then, the sectors' number Si, provided for the reference codification C, of total length dC, can be reduced and, consequently the realization costs of the respective reference codification C on the rod 5a of the mobile body can be also reduced.

As you will easily understand, the choice of the reference codification C according to the first or second realization example of the present invention will depend on different factors, among which the dimensions of the seat provided for the detecting means 7, which limits the maximum amplitude d7c of the detecting zone of the sensors' means 7b along the longitudinal axis of the cylinder-piston unit. Another important factor is the facility (or not) of the reference codification's manufacturing.

The cylinder-piston unit according to the present invention includes moreover a control and data elaboration unit 14 (FIGS. 1a and 1b), provided as much internally to the detecting means 7 as external to them, in charge to the reception and to the elaboration of the electrical signal at the output of each sensor's means s7.

According to the elaboration of the input received signal/s, typically of analogue type, the control and data elaboration unit 8 emits at its output an index P correlated to the reciprocal position between cylinder and piston of the cylinder-piston unit 1.

The continuous detection of the reciprocal position between cylinder and piston of the cylinder-piston unit 1 according to the present invention, is than ever simple and reliable.

Such detecting, refer to the FIG. 5a, consider an initial phase 100 of activation of the detecting means 7, in response to that these means emit one ore more electrical output signals s7 depending on the configuration of the respective sensors' means 7b.

Later, at the phase 200, the signal or the electrical signals s7 in output of the detecting means are elaborated and, in response to that elaboration, from the control unit and data elaboration 8, an index P correlated to the reciprocal position between cylinder and piston of the cylinder-piston unit is determined.

If desired, such index can be sent to suitable means of input/output (phase 300) for this purpose provided in the cylinder-piston unit for the visualization and/or possible additional elaboration of the index P thus determined. The input/output means aren't illustrated in the drawings.

With particular reference to the phase 200 of signal's elaboration (see FIGS. 5b and 5c), the method according the present invention includes a phase 210 of pre-elaboration of the signal or signals s7 and a further phase 220 of elaboration outright.

In the phase 210 of pre-elaboration, the signal or the signals s7 are interpolated (phase 211), for example with a linear interpolation in case you want to increase the system's resolution. If desired, the contrast between maximum and minimum amplitude of the signal so interpolated is regulated (phase 212), if, for example, such contrast is lower than a certain value of threshold preconceived, for example equal to Vcc/2. As you will easily understand, with this contrast regulation, the signal s7 to elaborate, is made independent from factors, related for example to the worn of the rod 5a, which causes, with the passing time, at the output of the detecting means, the emission of a signal/signals s7 having an amplitude's difference always lower between different optical contrast zones (si1, si2, si3, ecc.).

In addition or alternatively, as you will easily understand, the skilled person will consider, in this phase of the method according to the present invention, to elaborate the s7 signal with additional elaboration's techniques by means of, for example, geometrical distortion's corrections on the pixels of the corresponding CCD sensor, mapping of some Si sectors in the memory, for an easier and rapid identification of the sector of which the s7 signal is the reference, study of the minimal values of the s7 signal, introduction of offset for compensating possible marking non uniformities on the rod 5a, which reflects inevitably on the corresponding acquired s7 signal ecc.

On the signal so pre-elaborated, indicated on the FIG. 5b with the reference s7', is then identified the reference codification C (phase 213) and, more particularly, the optical contrast zones si1, si2, si3 ecc. are recognized.

Such identification, refer to the FIG. 4, is carried out with a classification of the signal on the base of at least one threshold. Such thresholds, that in the examples of realization illustrated are two, include a maximum threshold SH, close to the saturation voltage of the system Vcc, and a minimum threshold SL, for example equal to 3Vcc/4.

If the signal s7' has an amplitude greater than SH, then it is identified as optical contrast's zone si2.

If the signal s7' has an amplitude lower than SL, then it is identified as optical contrast's zone si1.

If the signal s7' has an intermediate amplitude, it is classified as relative to a transition zone between si1 and si2.

According to such classification, the signal s7, in output to the detecting means, is transformed in an electrical signal with steps, that presents vertical rising and falling edges, and indicated as the reference s7".

Such signal s7" is further elaborated at the phase 220.

The phase 220 considers the measurement, on the s7" signal, of the extension of the optical contrast zone/s si1, si2, si3, ecc, between those identified in the previous phase, that result/s completely represented in the signal s7', since, as above mentioned, the system's geometry is such that starting to their extension dsi1, dsi2, dsi3, ecc. it is possible to go back up univocally to the sector belonging to the zone/s in the reference codification C.

In the particular case in which the reference codification C includes sectors Si in which only two optical contrast zones si1 and si2 are obtained, the extension of optical contrast zone/s dsi1, dsi2, completely represented in the signal s7" is determined at the phase 221, according of the distance's calculation between a rising edge and the next falling edge (respectively si2a and si2b, in case of si2) of the signal s7" or, vice versa, at the phase 222, according to the calculation of the distance between a falling edge an the next rising edge (respectively si1a and si1b, in case of si1) of the signal.

Different procedures allow identifying the position of the rising and/or falling edges of the steps' signal s7". According to the FIG. 5c, the initial portion of the signal s7", corresponding for example to the first pixel of the CCD sensor, is compared to one ore more reference values in order to establish if it is associatable to a marked section or not of the reference codification C (si1 or si2).

If the initial portion of the signal s7" is referred, for example, to the optical contrast zone si1, the rising and/or falling edges of the signal s7 that will be determined will be those concerning to the adjacent optical contrast zone/s, and, in the specific case of the illustrated manufacturing examples, those concerning the optical contrast zone si2 (see FIG. 5c). Vice versa, if the initial portion of the signal s7" concerns an optical contrast zone si2, the rising and/or falling edges relative to the adjacent zone or zones si1 will be determined. In case of, in the end, in which the signal s7" is related to the transition zone between an optical contrast zone si1 and an optical contrast zone si2 or vice versa, the detecting means 7 will be detecting truly a rising or falling edge of the signal and, therefore, the system will proceed to the individuation of the next rising and/or falling edge, on the s7" signal. Once the positions of the rising and/or falling edges of the s7" signal are known it is obvious to determine, for difference, the extension dsi1 or dsi2 of the relative optical contrast zone so identified and, consequently, through a comparison, the i-th sector Si of the reference codification C to which such zone or such zones are belonging (phase 223).

Once the belonging sector of the codification C section is noted which is detected from the detecting means 7 it is possible to detect the index P correlated to the reciprocal position between cylinder and piston of the cylinder-piston unit, according to the resolution (R) of the sensor/s means 7b and the possible zoom factor (FZ) to it/them associated (phase 224).

Such index P corresponds, in substance, to the distance to which, in that moment (instant t), the piston of the cylinder-piston unit is located, compared to its stand-off position, and it is given from the following formula:

$$Plt=(Si\times(d7C\times FI))+si1a)\times(R/(FZ\times FI))$$

where:
Si indicates the identified sector in correspondence to the detecting zone 7c of the detecting means, at the phase 223,
D7c is the amplitude (expressed in pixels) of the detecting zone of the CCD sensor,
Si1a is the position of the rising edge of the elaborated signal expressed in pixel;
R is the resolution of the detecting means;
Fz is the zoom factor;
Fi is the interpolation factor.

Obviously, in the case of signal's interpolation as above described, d7c will be multiplied for the correspondent interpolation factor Fi, for example equal to ×2, as the zoom factor Fz.

Example

A 256 pixels CCD type sensor's means (in which each pixel has an extension equal to 63.5 um) and a zoom factor (correlated to the piston's rod's bending and to the morphology of the emitter/s 7a) for example equal to 2× are given, the amplitude d7c of the detecting zone of the device 7c is approximately equal to 63.5 um×256 pixel=16 mm The amplitude dSi of each sector Si obtained on the cylinder-piston unit's rod is, then, at most equal to 16 mm/2=8 mm.

Let's suppose that each sector Si is equipped of two optical contrast zones si1 and si2, the extension's sum dsi1 and dsi2 of such zones, in each sector Si, will be, according to the present invention, lower or equal to 8 mm, for example equal to 7.5 mm, such as it is possible to distinguish clearly, in correspondence of the detecting zone 7c, the passage from a zone to the other during the piston's travel into the cylinder 1.

Let suppose that the reference codification C extends along a section of length dC equal to 240 mm on the rod of the cylinder-piston unit, the number of sectors Si of the codification C is equal to 240 mm/7.5 mm=32.

The difference of extension between two corresponding zones si1 or si2, belonging to adjacent sectors, is for example equal to 0.1905 mm, actually corresponding to 6 CCD sensor's pixels.

With a 256 pixels CCD type sensor's means, indeed, in which each pixel has an extension of 63.5 um and a zoom factor of 2×, you have that 0.1905 mm=190.5 um/(63.5/2)= 190.5/31.75=6 pixels. If, in addition, an interpolation factor of 2× is expected, the extension's difference between two corresponding zones si1 or si2, belonging to adjacent sectors, would be equal to 6 pixels×2=12 pixels.

With a such configuration, the reference codification C is provided of 32 sectors, the first of each Si is interested from a zone s11 of extension equal to 1 mm, (the corresponding zone s12 having extension for example equal to 7.5 mm-1 mm=6.5 mm). The corresponding optical contrast zones s21, s31, s41, ecc. belonging to the respective sectors S2, S3, S4, ecc. will have extensions as increasing from sector to sector of 0.1905 mm, till having, in the last sector, S32 an extension equal to 1 mm+(0.1905 mm×31)=7.096 mm→corresponding to approximately 14 mm detectable to the sensor's means 7b.

With a such configuration, executing for example a linear interpolation of the acquired signal s7, with a Fi factor of 2×, the reciprocal position between cylinder and piston in the cylinder-piston unit, in a given instant t, is expressed in the formula:

$$Plt=((Si\times(d7C\times FI))+si1a)\times(R/(FZ\times FI))$$

that is $$Plt\ [um]=((Si\times(255\times 2))+si1a)\times(31.75/2))\ [um]$$

You will easily understand that, the method according to the present invention is executed continuously and therefore, little by little the piston travels inside the cylinder, moving along the cylinder compared to its stand-off position, the index Plt is constantly updated.

The cylinder-piston unit and the method above mentioned are susceptible of numerous modifications and variants inside the limit of protection defined from the following claims.

So for example, preliminary at the initial phase 100 of activation of the detecting means 7, a phase of calibration of the detecting means 7 and of the data control and elaboration unit 8 can be provided.

Again, the contrast regulation of the signal 7 at the output of the detecting means 7 can be implemented from the data control and elaboration unit 14 through instructions executable from the data control and elaboration unit 14 or manually. In this second case the cylinder-piston unit according to the present invention includes suitable light intensity regulation means, in use, delivered by the emitters means 7a.

In order to regulate the contrast signal s7 at the output of the detecting means 7 a manual action is possible or through instructions, executable from the data control and elaboration unit 8, on the direction of the radiation light RL incident on the rod 5a, or on the integration time of the pixels.

In the end you will understand that, in case in which the reference codification C, comprises in each sector Si, three or more optical contrast zone (si1, si2, si3, si4), such codification C will be represented in each sector Si, through combination of couples or triplets of such optical contrast zones. In this way, at same length dC of the reference codification C along the piston's rod, the amplitude's differences dsi1, dsi2, dsi3, dsi4 of each zone, between a sector and another, could be more accentuated and therefore better detectable from the system.

Couples or triplets of such zone allow, at same dimensions dS of each sector Si, a number of combinations such that the reference codification C can be manufactured of a greater length dC. In some applications, for example with cylinder-piston unit of big dimensions, this results very advantageously.

In case of the reference codification C will be interested, in each sector, from three or more optical contrast zones (do particular reference to the FIG. 2b), the detecting method in continuous of the reciprocal position between cylinder and piston of the cylinder-piston unit 1 according the present invention, implements some compensating functions, as for example those object of the patent Italian request VR2013A000024 at the name of same applicants.

What is claimed is:

1. A cylinder-piston unit including:
   at least one cylinder including a tubular body;
   at least one piston liable with a respective rod, said piston and said rod being translatable longitudinally in said tubular body of said cylinder,
   at least one reference codification (C) extending for at least a section (dC) on a surface of said rod, along a longitudinal axis of said rod;
   at least one detector, which is movable and anchorable to said tubular body, said one detector is faced, in use, towards said rod and is configured to detect said at least one reference codification (C) and to emit at an output at least one corresponding output electrical signal,
   at least one reference zone of amplitude (d7c) delimited from said at least one detector, and said at least one reference codification (C) being detectable in correspondence to at least one detection zone (7c);
   wherein said at least one reference codification (C) includes at least one plurality of adjacent sectors ( . . . , Si−1, Si, Si+1, . . . ) extending along said longitudinal axis of said rod, each of the plurality of adjacent sectors is for a section (dSi) of equal length;
   each sector (Si) includes a plurality of optical contrast zones (si1, si2, si3), each of the plurality of optical contrast zones extending along said longitudinal axis of said rod for a respective section of extension (dsi1, dsi2, dsi3) such that the sum of the extensions of said sections of extensions (dsi1+dsi2 . . . ), in each sector (Si) is lower or equal to said amplitude (d7c) of said reference zone (7c);
   said optical contrast zones (si1, si2, si3) are arranged in each sector (Si) according to a same sequence; and
   wherein in each sector (Si), at least one said optical contrast zone (si1, si2, si3) shows said at least one respective section of extension (ds1, ds2, ds3) of a different length compared to a respective length of a same section of extension in other sectors (Si−2, Si−1, Si+1, Si+2, . . . ), whereby each sector (Si) remains univocally definable from the length of said at least one section of extension (dsi1, dsi2, dsi3) of said optical contrast zones (si1, si2, si3) in said sector (Si).

2. A cylinder-piston unit according to claim 1, wherein said at least one detector includes at least one emitter of light radiations (RL) and at least one sensor of said light radiations (RL) disposed along an axis parallel to the longitudinal axis of said rod.

3. A cylinder-piston unit according claim 1, including a data control and elaboration unit of said at least one output signal, said data control and elaboration unit being electrically connected to said detector.

4. A cylinder-piston unit according to claim 2, including a regulator of light intensity suppliable from said at least one emitter of light radiations (RL), said regulator being electrically connected to a control and elaboration unit.

5. A cylinder-piston unit according to claim 1, wherein said at least one detector is movable and is anchorable to said tubular body, is provided receivable in at least one through receiving seat in said cylinder provided.

6. A cylinder-piston unit according to claim 1, including at least one disc body which is movable and anchorable to said cylinder and is provided with at least a through receiving seat configured to accommodate said at least one detector.

7. A method of continuous detection of a reciprocal position between a cylinder and a piston of a cylinder-piston unit, said method including phases of:
   providing a cylinder-piston unit according to claim 1;
   activating said at least one detector (phase 100);
   elaborating said at least one output signal in output to said detector (phase 200);
   emitting, according to the elaboration (phase 200), of an index (P) correlated to the reciprocal position in that moment assumed between said cylinder and said piston;
   wherein said elaboration phase of said at least one signal includes a measurement (phase 220), on said at least one output signal, of the length of said at least one section of extension (ds1, ds2, ds3) of said optical contrast zone/s (si1, si2, si3), that become completely represented in said signal.

8. A method according the claim 7, wherein said elaboration phase (phase 220) includes a phase of defining a position of rising and/or falling edges (si1a, si1b, si2a, si2b) of said signal from said detector.

9. A method according to claim 7, wherein said elaboration phase (phase 220) includes a defining phase of said sector (Si) of said reference codification (C) starting from an amplitude of said at least one section (ds1, ds2, ds3) of said optical contrast zone (si1, si2, si3) completely represented in said signal.

10. A method according to claim 8, wherein said reciprocal position between said cylinder and said piston of said cylinder-piston unit is correlated to said sector (Si) of said reference codification (C) and to said rising and/or falling edges (si1$a$, si2$a$) of said at least one section (dsi1, dsi2) of said optical contrast zone (si1, si2) completely represented in said signal.

11. A method according to claim 7, wherein the fact that said index (P) correlated with said reciprocal position between said cylinder and said piston depends:
- from a rising and falling edges (si1$a$, si1$b$, si2$a$, si2$b$) position of said signal detected from said detector;
- from said sector of said optical contrast zone/s, that result or results completely represented in said signal;
- from possible interpolation factors (FI) of said signal;
- from a resolution (R) of said detector;
- from a zoom factor (FZ) of said detector according to a formula:

$Plt=((Si \times (d7C \times FI))+si1a) \times (R/(FZ \times FI))$.

12. A method according to claim 7, wherein said elaboration phase (phase 200) of said at least one output signal includes a pre-elaboration phase (phase 210) in which said signal is classified through the use of at least one threshold value (SH, SL)(phase 213).

* * * * *